United States Patent
Collins, III et al.

(10) Patent No.: US 8,514,020 B2
(45) Date of Patent: Aug. 20, 2013

(54) TEMPERATURE COMPENSATED FEEDFORWARD LINEARIZER

(75) Inventors: Thomas E. Collins, III, Tyngsboro, MA (US); Gregory M. Flewelling, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 98 days.

(21) Appl. No.: 13/220,339

(22) Filed: Aug. 29, 2011

(65) Prior Publication Data

US 2013/0049869 A1    Feb. 28, 2013

(51) Int. Cl.
*H03F 1/00*    (2006.01)
*H03F 3/04*    (2006.01)

(52) U.S. Cl.
USPC ............................... 330/151; 330/289

(58) Field of Classification Search
USPC .......................... 330/151, 289, 256
See application file for complete search history.

(56) References Cited

U.S. PATENT DOCUMENTS

| 5,148,119 | A | 9/1992 | Wright et al. |
| 5,757,234 | A * | 5/1998 | Lane ............................... 330/256 |
| 6,771,124 | B1 * | 8/2004 | Ezell ............................. 330/129 |
| 7,224,210 | B2 | 5/2007 | Garlapati et al. |
| 7,595,691 | B2 * | 9/2009 | Shiau et al. .................... 330/258 |

* cited by examiner

*Primary Examiner* — Robert Pascal
*Assistant Examiner* — Khiem Nguyen
(74) *Attorney, Agent, or Firm* — Finch & Maloney PLLC; Neil F. Maloney; Daniel J. Long

(57) ABSTRACT

A feedforward linearizer device is disclosed. The device includes a main amplifier, and a linearizing amplifier operatively coupled to the main amplifier. A first reference generator is operatively coupled to the main amplifier by a first reference node. A second reference generator is operatively coupled to the linearizing amplifier by a second reference node, and is configured to cause an optimal linearizing amplifier output current for each of a plurality of temperatures. In one such case, the second reference generator is configured to cause an optimal linearizing amplifier output current for each of a plurality of temperatures based on a corresponding optimal ratio of main amplifier output current and linearizing amplifier output current. The linearizing amplifier may be configured with a tunable current source that is controlled by the second reference generator, or a current source having a fixed total transistor area (not tunable).

11 Claims, 8 Drawing Sheets

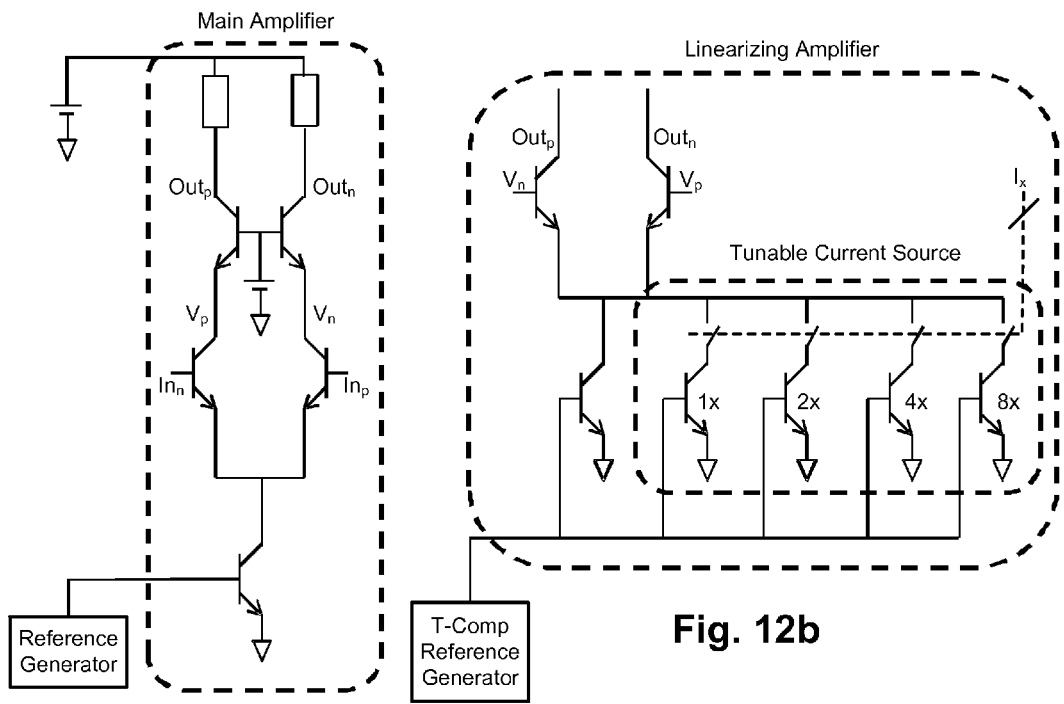
Fig. 12a
Fig. 12b
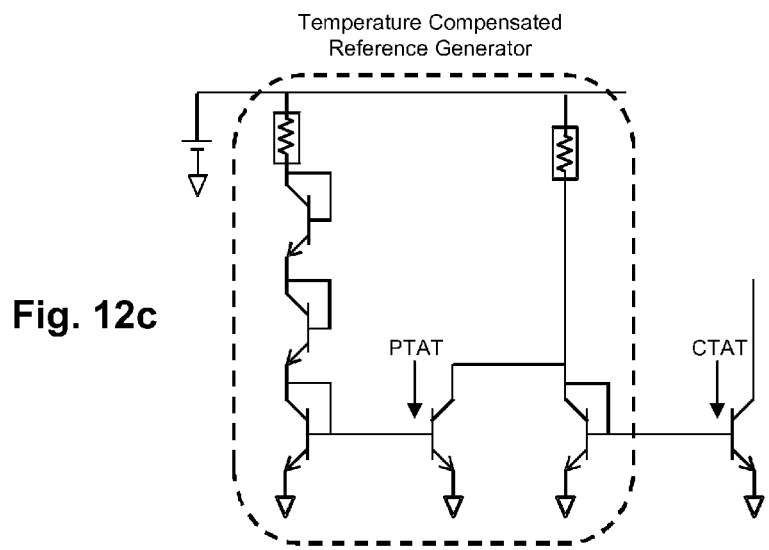
Fig. 12c

TEMPERATURE COMPENSATED FEEDFORWARD LINEARIZER

STATEMENT OF GOVERNMENT INTEREST

The invention was made with United States Government support under contract FA8650-09-C-7926 awarded by the Air Force, and the United States Government has certain rights in this invention.

FIELD OF THE DISCLOSURE

The invention relates to amplifiers, and more particularly, to temperature compensated feedforward linearizers.

BACKGROUND

As the input power to a radio frequency (RF) amplifier is increased, the intermodulation distortion of the amplifier increases, thereby reducing the dynamic range of the amplifier. This effect can be cancelled using a feedforward linearizer configuration, but typical feedforward linearizer solutions are generally not valid over a broad temperature range. In an effort to compensate for temperature change, the feedforward linearizer can be configured with a standard or bandgap current reference generator. Still, the effectiveness of such feedforward linearization configurations is only valid over a relatively small temperature range.

SUMMARY

One embodiment of the present invention provides a method for making a feedforward linearizer device. The method includes providing a main amplifier having a first reference node, and providing a linearizing amplifier operatively coupled to the main amplifier and having a second reference node. The method further includes providing a first reference generator operatively coupled to the main amplifier by the first reference node, and providing a second reference generator operatively coupled to the linearizing amplifier by the second reference node and being configured to cause an optimal linearizing amplifier output current for each of a plurality of temperatures. In one such embodiment, providing a second reference generator includes identifying peak linearity of the linearizing amplifier for one or more linearizing amplifier current settings at each of the temperatures, wherein peak linearity is measured by the $3^{rd}$ order output intercept point (OIP3). In one such case, providing a second reference generator further includes measuring main amplifier output current at each of the temperatures, and measuring linearizing amplifier output current for each of the one or more linearizing amplifier current settings at each of the temperatures. In one such example case, providing a second reference generator further includes determining a ratio of the main amplifier output current and the linearizing amplifier output current for each of the one or more linearizing amplifier current settings at each of the temperatures. In one such example case, providing a second reference generator further includes identifying an optimal ratio of the main amplifier output current and the linearizing amplifier output current for the peak linearity of the linearizing amplifier for the one or more linearizing amplifier current settings at each of the temperatures. In one such example case, providing a second reference generator further includes determining the optimal linearizing amplifier output current for each of the temperatures based on the corresponding main amplifier output current and optimal ratio of the main amplifier output current and the linearizing amplifier output current for the peak linearity, and configuring the second reference generator to cause the optimal linearizing amplifier output currents for the plurality of temperatures. In some cases, there is a plurality of linearizing amplifier current settings.

Another embodiment of the present invention provides a feedforward linearizer device. The device includes a main amplifier having a first reference node, and a linearizing amplifier operatively coupled to the main amplifier and having a second reference node. The device further includes a first reference generator operatively coupled to the main amplifier by the first reference node. The device further includes a second reference generator operatively coupled to the linearizing amplifier by the second reference node, and configured to cause an optimal linearizing amplifier output current for each of a plurality of temperatures. In one such case, the second reference generator is configured to cause an optimal linearizing amplifier output current for each of a plurality of temperatures based on a corresponding optimal ratio of main amplifier output current and linearizing amplifier output current. In another example case, the linearizing amplifier is associated with a peak linearity for one or more linearizing amplifier current settings at each of the temperatures, wherein peak linearity is measured by the $3^{rd}$ order output intercept point (OIP3). In another example case, the linearizing amplifier is configured with a tunable current source that is controlled by the second reference generator so as to provide a plurality of linearizing amplifier current settings. In another example case, the linearizing amplifier is configured with a current source having a fixed total transistor area (not tunable). In another example case, the device is implemented as a system-on-chip or chip set. In another example case, the second reference generator is configured such that it only has dependency one resistor type and one transistor type. In one such example case, the resistor type is polysilicon and one transistor type is NPN. Note, however, that any number of component types can be used.

Another embodiment of the present invention provides a feedforward linearizer device. The device includes a main amplifier having a first reference node. The device further includes a linearizing amplifier operatively coupled to the main amplifier, and having a second reference node, wherein the linearizing amplifier is associated with a peak linearity for one or more linearizing amplifier current settings at each of a plurality of temperatures, wherein peak linearity is measured by the $3^{rd}$ order output intercept point (OIP3). The device further includes a first reference generator operatively coupled to the main amplifier by the first reference node. The device further includes a second reference generator operatively coupled to the linearizing amplifier by the second reference node, and configured to cause an optimal linearizing amplifier output current for each of a plurality of temperatures based on a corresponding optimal ratio of main amplifier output current and linearizing amplifier output current. In one such case, the linearizing amplifier is configured with a tunable current source that is controlled by the second reference generator so as to provide a plurality of linearizing amplifier current settings. In another example case, the linearizing amplifier is configured with a current source having a fixed total transistor area. In another example case, the device is implemented as a system-on-chip or chip set. In another example case, the second reference generator is configured such that it only has dependency one resistor type and one transistor type.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 12a illustrates an example main amplifier of a feedforward linearizer configured in accordance with an embodiment of the present invention.

FIG. 12b illustrates an example linearizing amplifier of a feedforward linearizer configured in accordance with an embodiment of the present invention.

FIG. 12c illustrates an example temperature compensated reference generator of a feedforward linearizer configured in accordance with an embodiment of the present invention.

DETAILED DESCRIPTION

Figure 1A:
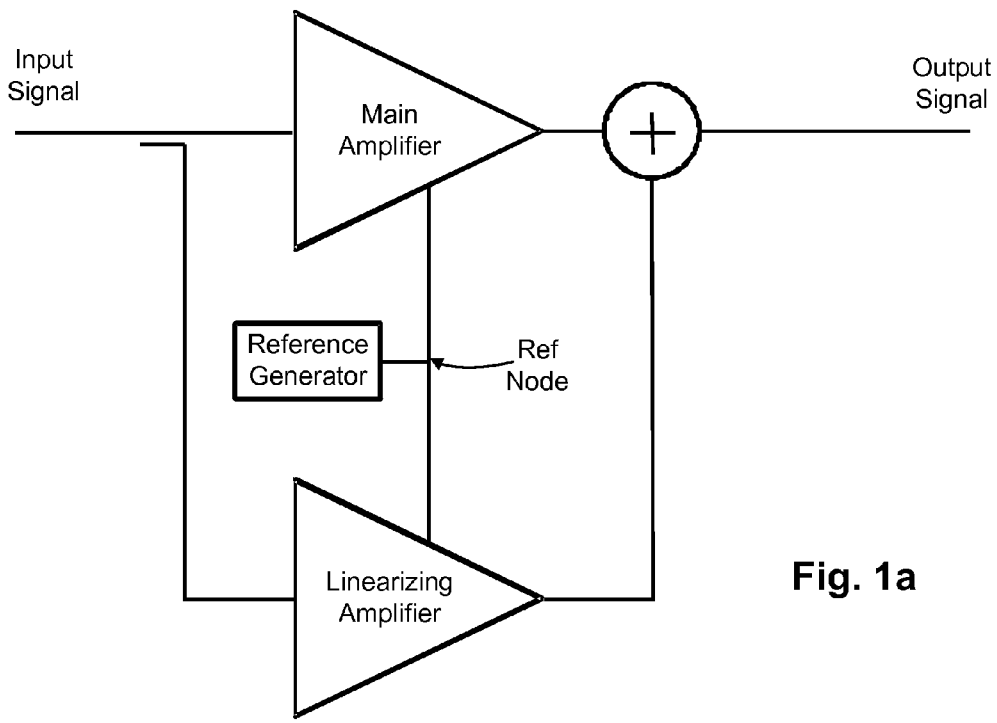
FIG. 1a illustrates a typical feedforward linearizer configured with main and linearizing amplifiers and a reference generator coupled to a common reference node of the amplifiers.

As previously explained, the effectiveness of feedforward linearization in RF amplifiers is generally valid over a relatively small temperature range. FIG. 1a illustrates a typical feedforward linearizer configured with main and linearizing amplifiers coupled to one another via a reference node. A reference generator is coupled to the reference node. The main amplifier is configured to apply linear gain to the input signal, but in reality, it applies a non-linear gain which in turn creates intermodulation distortion. The linearizing amplifier samples the input signal from the main amplifier input path, distorts that sampled signal, and feeds it forward back into the main amplifier output path 180° out-of-phase with the input signal so as to cancel out any intermodulation distortion products caused by the main amplifier. The reference generator produces a voltage which is predictable over temperature and varying amounts of load, and is used to set the current through both the main and linearizing amplifiers (by way of the reference node). The reference generator can be configured to have a flat response over temperature (commonly called a bandgap reference), or to be a proportional to absolute temperature (PTAT) reference or a complimentary to absolute temperature (CTAT) reference. In the context of a feedforward compensated amplifier, the reference generator is used to set the current through both the main and linearizing amplifiers. As will be appreciated in light of this disclosure, such conventional designs are associated with a number of non-trivial problems.

Figure 1B:
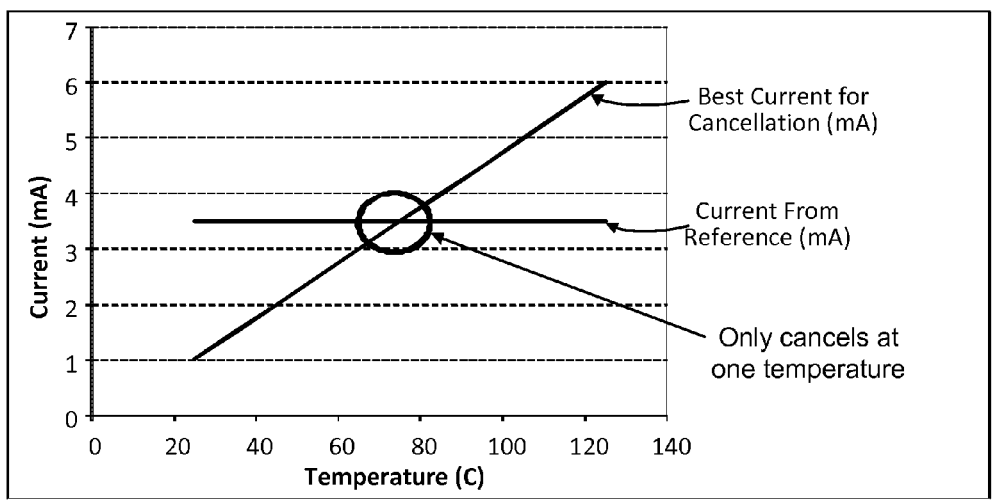
FIG. 1b illustrates the narrow temperature range over which the feedforward linearizer of FIG. 1a operates.

For instance, FIG. 1b illustrates the narrow temperature range over which the feedforward linearizer of FIG. 1a operates. As can be seen, the current to be cancelled increases with increasing temperature, but the reference current stays the same. As a result, the feedforward technique actually only cancels at a single temperature, as best shown in FIG. 1b. Even if that single temperature is expanded to range of neighboring temperatures (based on some degree of acceptable margin), that range will likely be inadequate for many applications that involve or are otherwise susceptible to large temperature variations (e.g., 10° C. or greater).

In accordance with an embodiment of the present invention, the reference node is split between the main and linearizing amplifiers, and a first reference generator is operatively coupled with the main amplifier and a second reference general is operatively coupled with the linearizing amplifier. By matching the thermal coefficient of the reference generator for linearizing amplifier to the relative change in intermodulation distortion (linearity), the usable temperature range of the linearizing amplifier can be increased which in turn increases the usable temperature range of the overall feedforward linearizer configuration.

In more detail, there is a strong temperature dependence in the intermodulation distortion of the main amplifier, and it is therefore effective to compensate for the temperature dependence by creating a custom reference current for the linearizing amplifier such that the intermodulation distortion of the linearizing amplifier has the same temperature dependence as the main amplifier (or otherwise within a reasonable tolerance of the temperature dependence as the main amplifier, such as within 20% thereof or within 10% thereof). The techniques provided herein can be applied to any number of applications (e.g., analog RF amplifiers) and any number of reference generator implementations for the linearizing amplifier.

Figure 2A:
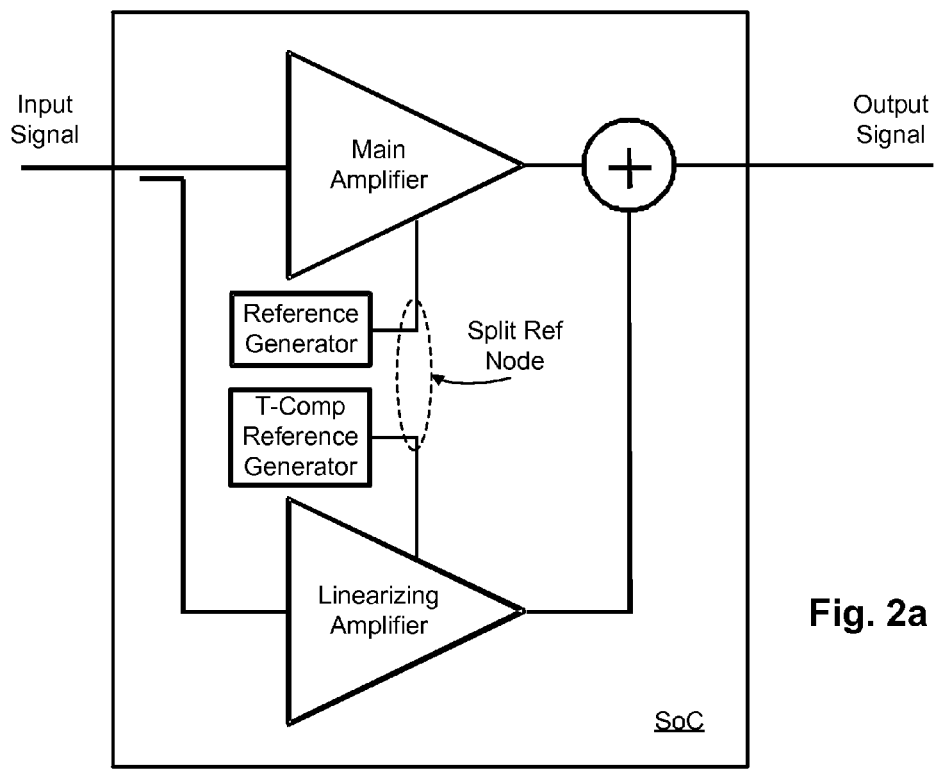
FIG. 2a illustrates a feedforward linearizer configured in accordance with an embodiment of the present invention.

In one example embodiment, and as best shown in FIG. 2a, a feedforward linearizer structure having a main amplifier and a linearizing amplifier is configured for linearity improvements, by coupling the linearizing amplifier to the input of the main amplifier (before the signal is distorted). In addition, the output of the linearizing amplifier, which is 180° out-of-phase with the output of the main amplifier, is connected to the output of the main amplifier via a summing junction, thereby causing distortion signals to cancel. As can be further seen, a first reference generator is operatively coupled to the main amplifier, and a second reference generator is operatively coupled to the linearizing stage and is temperature compensated for linearity improvement across the temperature range of interest. The feedforward linearizer structure of this example embodiment is implemented as a system-on-chip (SoC). Other embodiments can be implemented, for example, as an integrated circuit chip set or on one or more printed circuit boards configured with various discrete components including amplification devices.

Figure 2B:
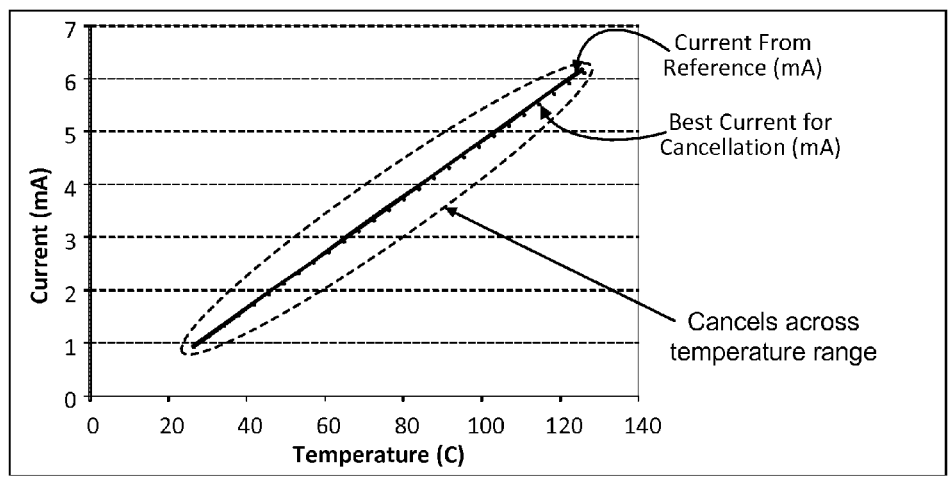
FIG. 2b illustrates the broad temperature range over which the feedforward linearizer of FIG. 2a operates.

As can be seen with reference to FIG. 2b, the current from the temperature compensated reference generator (solid line) substantially tracks the best current to be cancelled (dotted line) over a temperature range of about 20° C. to 120° C. Further note that the best current for cancellation varies significantly over that temperature range, from about 1 mA to 6 mA in this example case. In contrast, the current of the main amplifier varies very little over the temperature range, as will be further discussed with reference to the methodology shown in FIGS. 3-11.

Methodology

Figure 3:
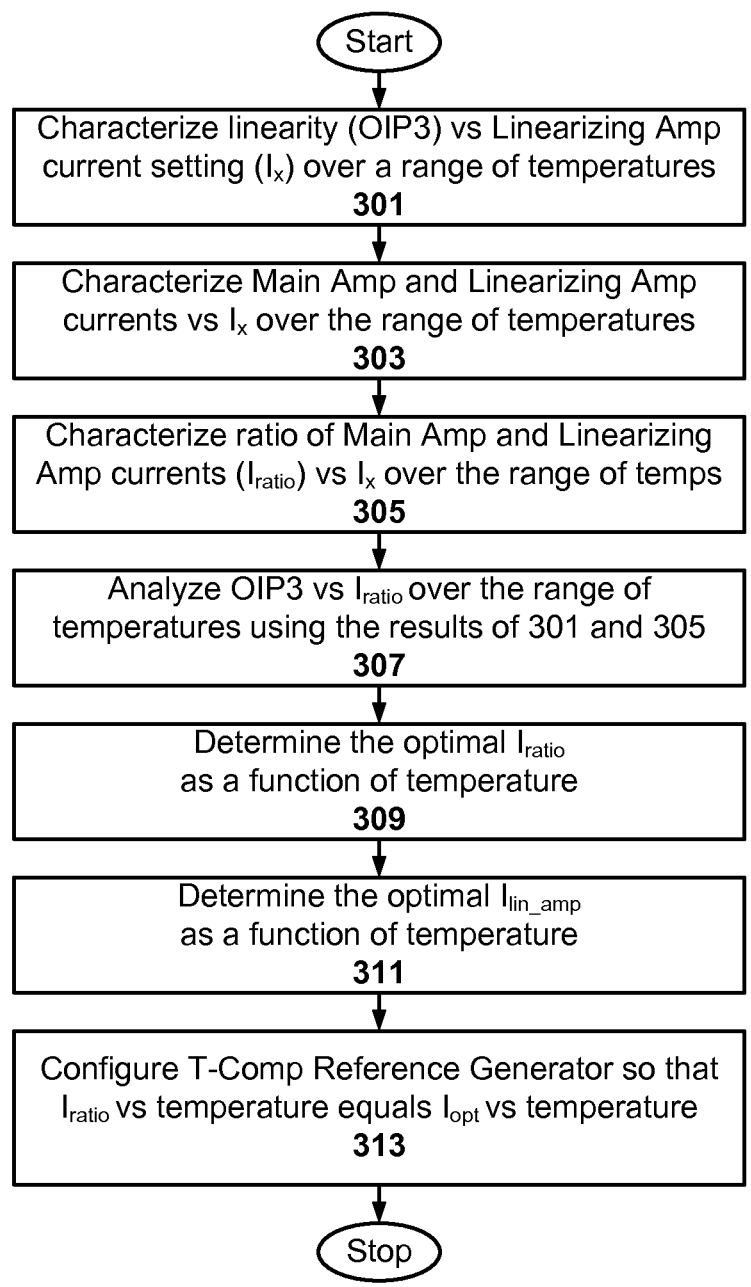
FIGS. 3 through 11 illustrate a method for designing a feedforward linearizer configured in accordance with an embodiment of the present invention.

FIG. 3 illustrates a method for designing a feedforward linearizer configured in accordance with an embodiment of the present invention. In one example embodiment, the feedforward linearizer can be configured as generally shown in FIG. 2a, which may be specifically implemented with a variable linearizing amplifier current source as shown in FIG. 12b. However, numerous other configurations will be apparent in light of this disclosure, including those embodiments having a fixed total current source area (non-tunable) for the linearizing amplifier.

Figure 4:
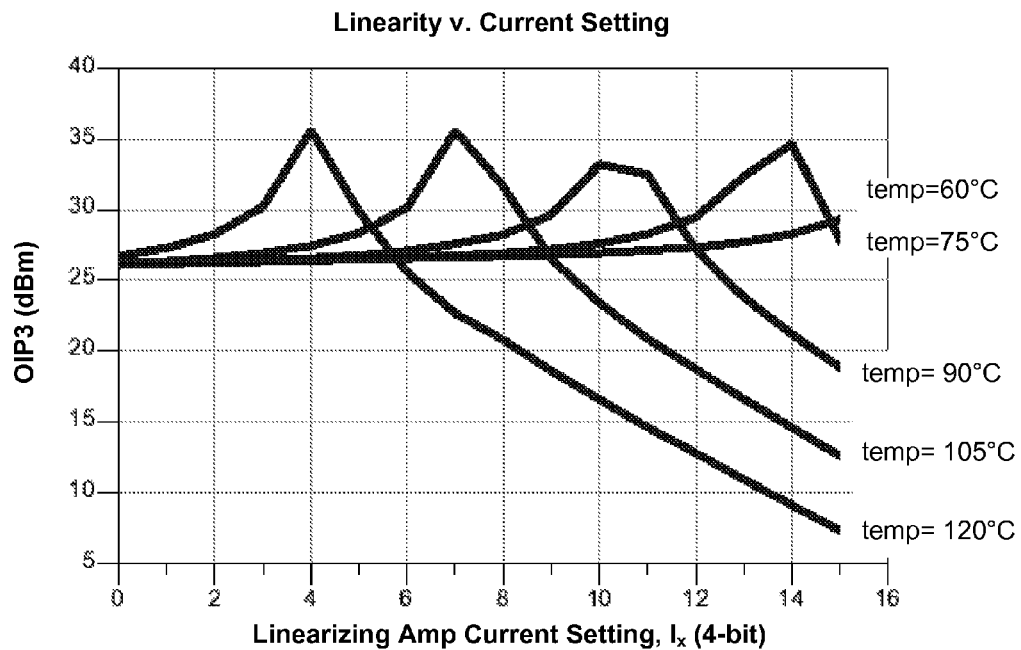

The method includes characterizing 301 linearity relative to the linearizing amplifier current setting ($I_x$) over a desired range of temperatures, and as best demonstrated in FIG. 4. Linearity can be measured by the $3^{rd}$ order output intercept point (OIP3). The linearizing amplifier current settings are represented by $I_x$, which in this example is a 4-bit binary word that switches in and out one or more weighted current sources. In general, the gain through the linearizing amplifier is a function of transistor area in the current source of the amplifier. As such, it follows then that the magnitude of the cancelling intermodulation terms from the linearizing amplifier, and thus the linearity of the overall system, is a function of $I_x$, which effectively determines the transistor area of the current source of the linearizing amplifier. Thus, $I_x$ can be selected for peak linearity performance. However, the optimal value of $I_x$ varies with temperature (i.e., the linearity amplifier current varies with temperature). In this sense, $I_x$ can be reset with temperature to achieve optimal linearity performance. As can be further seen with reference to the example OIP3 v. $I_x$ plot of FIG. 4, the desired temperature range of interest for this example is from about 60° C. to 120° C. (and more specifically, an OIP3 v. $I_x$ plot is provided for each of 60° C., 75° C., 90° C., 105° C., and 120° C.; note however that the resolution at which measurements are made with respect to temperature can vary). Thus, in this example embodiment, OIP3 can be measured at a given temperature for each of the $I_x$ values in the decimal range of 0 to 15 (which can be represented with 4 binary bits ranging from 0000 to 1111). Once plotted, the peak linearity (OIP3) for each temperature, along with the corresponding $I_x$ can be identified, as indicated in Table 1.

TABLE 1

| Temp | OIP3 | $I_x$ |
| --- | --- | --- |
| 60° C. | 29 dBm | 1111 |
| 75° C. | 34.5 dBm | 1110 |
| 90° C. | 33.5 dBm | 1010 |
| 105° C. | 36 dBm | 0111 |
| 120° C. | 36 dBm | 0100 |

Figure 5:
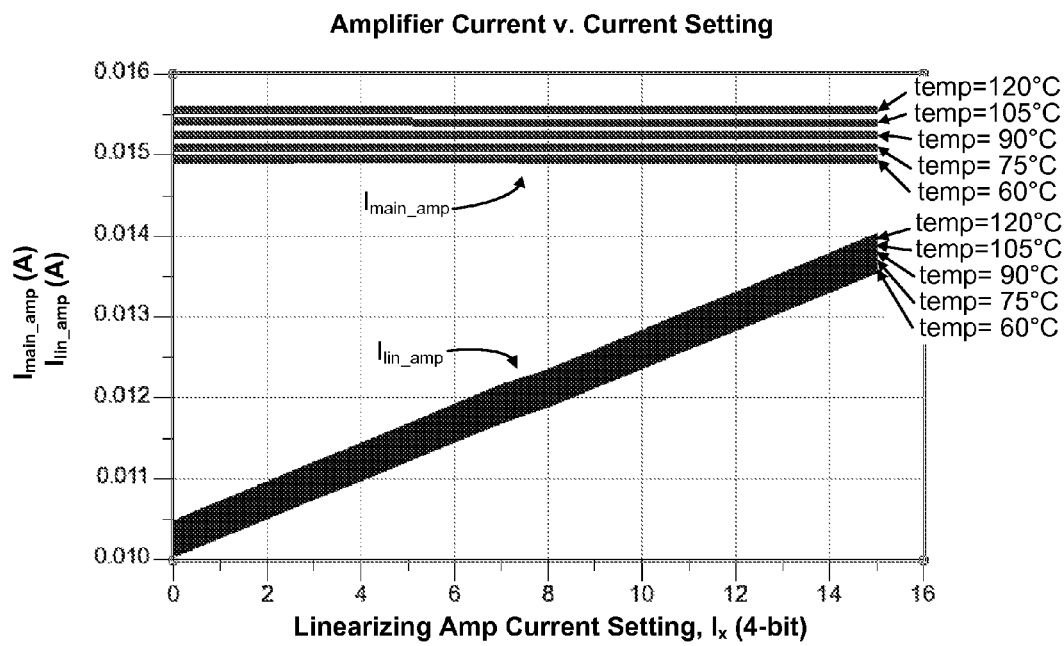

The method continues with characterizing 303 the main amplifier and linearizing amplifier currents relative to $I_x$ over the desired range of temperatures. FIG. 5 illustrates one such example characterization in accordance with one embodiment of the present invention, where the main amplifier current is represented by $I_{main\_amp}$ and the linearizing amplifier current is represented by $I_{lin\_amp}$. In this example embodiment, the currents $I_{main\_amp}$ and by $I_{lin\_amp}$ are each measured at 60° C., 75° C., 90° C., 105° C., and 120° C. (again, other resolutions with respect to temperature can be used, as desired). As can further be seen, $I_{lin\_amp}$ is a linear function of $I_x$ (i.e., as $I_x$ increases, the current source area of the linearizing amplifier increases, which in turn increases $I_{lin\_amp}$), and ranges from about 10 mA to about 14 mA over the 4-bit $I_x$ range (depending on the temperature). By design, $I_{main\_amp}$ is unaffected by $I_x$ (i.e., $I_x$ sets the current source transistor area of the linearizing amplifier, not the main amplifier). Thus, each output current of the main amplifier expectedly remains flat over the 4-bit $I_x$ range (in this example, $I_{main\_amp}$ is in the range of 14.9 mA to 15.6 mA, depending on temperature at which it is measured, as best shown in FIG. 5.

Figure 6:
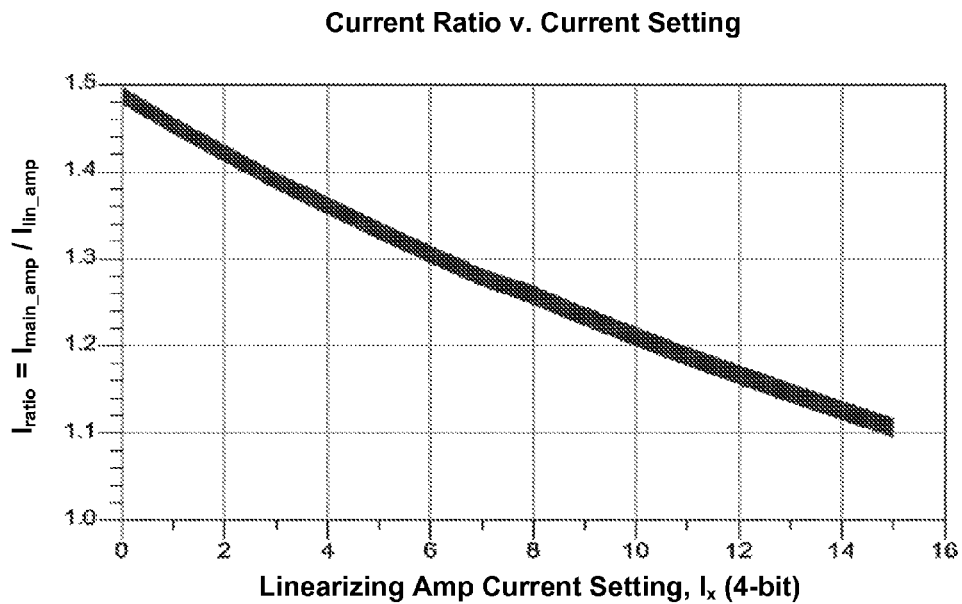

The method continues with characterizing 305 the ratio of main amplifier and linearizing amplifier currents relative to $I_x$ over the desired range of temperatures. FIG. 6 illustrates one such example characterization in accordance with one embodiment of the present invention, where the ratio of main amplifier current to linearizing amplifier current is designated $I_{ratio}$ (or $I_{main\_amp}/I_{lin\_amp}$), and can be computed based on the $I_{main\_amp}$ and $I_{lin\_amp}$ plots shown in FIG. 5 over the 4-bit $I_x$ range. Note that $I_{ratio}$ is generally unaffected by temperature (all lines fall on top of each other).

Figure 7:
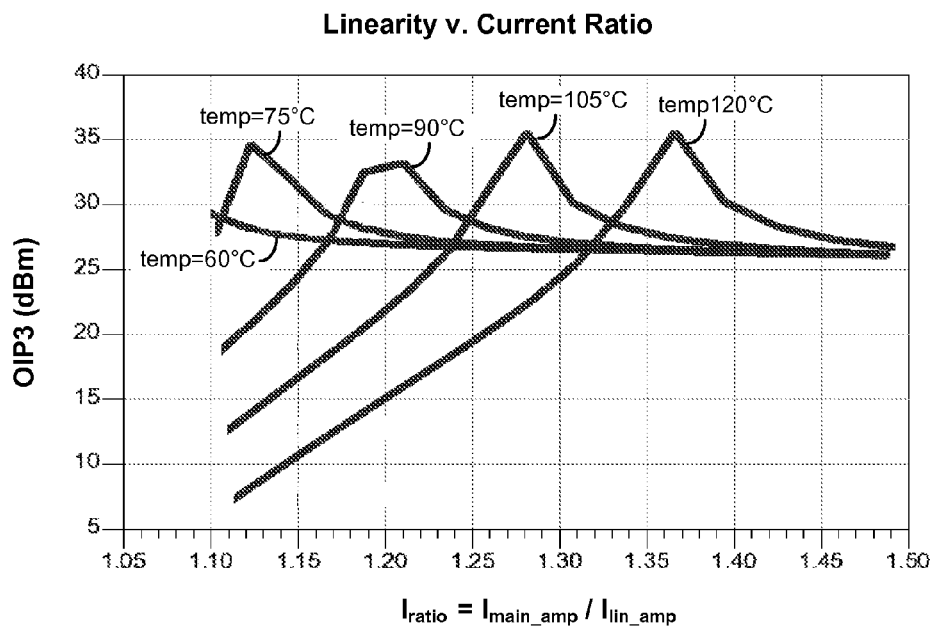

The method continues with analyzing 307 OIP3 relative to $I_{ratio}$ over the range of temperatures using the results of 301 and 305, and as best shown in FIG. 7. In particular, at each of the designated temperatures (in this example case, 60° C., 75° C., 90° C., 105° C., and 120° C.), each setting in the 4-bit $I_x$ range is associated with an OIP3 value (determined from FIG. 4) and an $I_{ratio}$ value (determined from FIG. 6). As can be seen with reference to FIG. 7, for each temperature plot, there is an optimal $I_{ratio}$ for peak linearity.

Thus, once OIP3 V. $I_{ratio}$ is plotted for a given temperature, the optimal $I_{ratio}$ that corresponds to peak linearity for that temperature can be identified, as indicated in Table 2.

TABLE 2

| Temp | OIP3 | $I_{ratio}$ |
| --- | --- | --- |
| 60° C. | 29 dBm | 1.1 |
| 75° C. | 34.5 dBm | 1.12 |
| 90° C. | 33.5 dBm | 1.22 |
| 105° C. | 36 dBm | 1.27 |
| 120° C. | 36 dBm | 1.37 |

Figure 8:
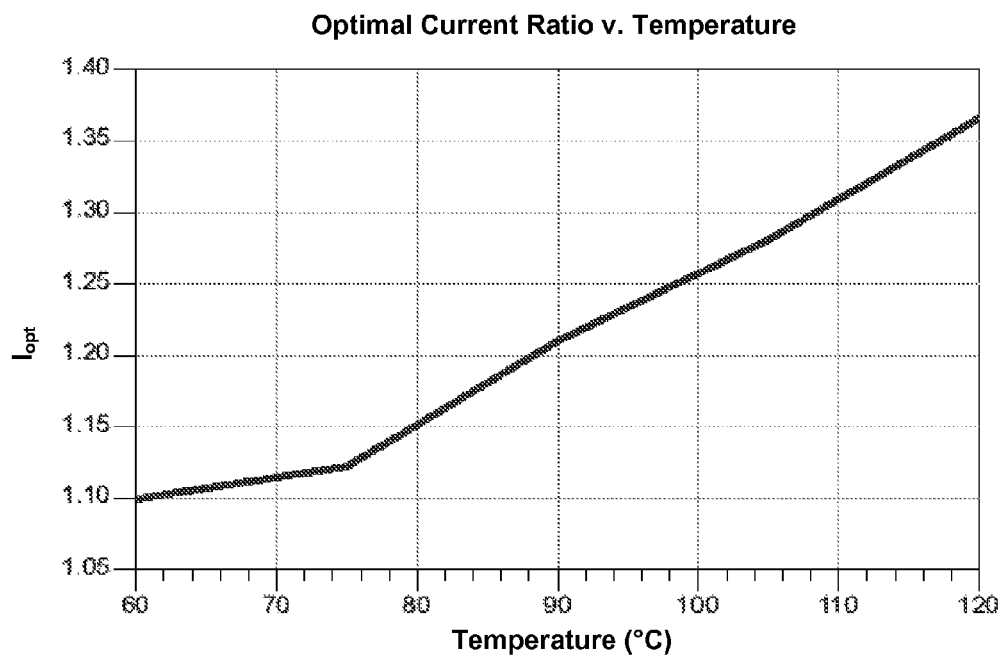

The optimal $I_{ratio}$ shown in Table 2 is generally referred to herein as $I_{opt}$. To this end, and with further reference to FIG. 3, the method continues with determining 309 the $I_{opt}$ as a function of temperature. A plot of the example $I_{opt}$ values as a function of temperature (e.g., from Table 2) is shown in FIG. 8. As can be seen, $I_{opt}$ is a strong function of temperature. In contrast, and as discussed with reference to FIG. 6, recall that there is very little temperature dependence on $I_{ratio}$. From this, it should now be apparent that in a conventional feedforward linearizer configuration, where the main and linearizing amplifiers share the same (or matched) reference generators, that providing a nominal $I_{ratio}$ (as opposed to an optimal $I_{ratio}$) can be problematic.

Figure 9:
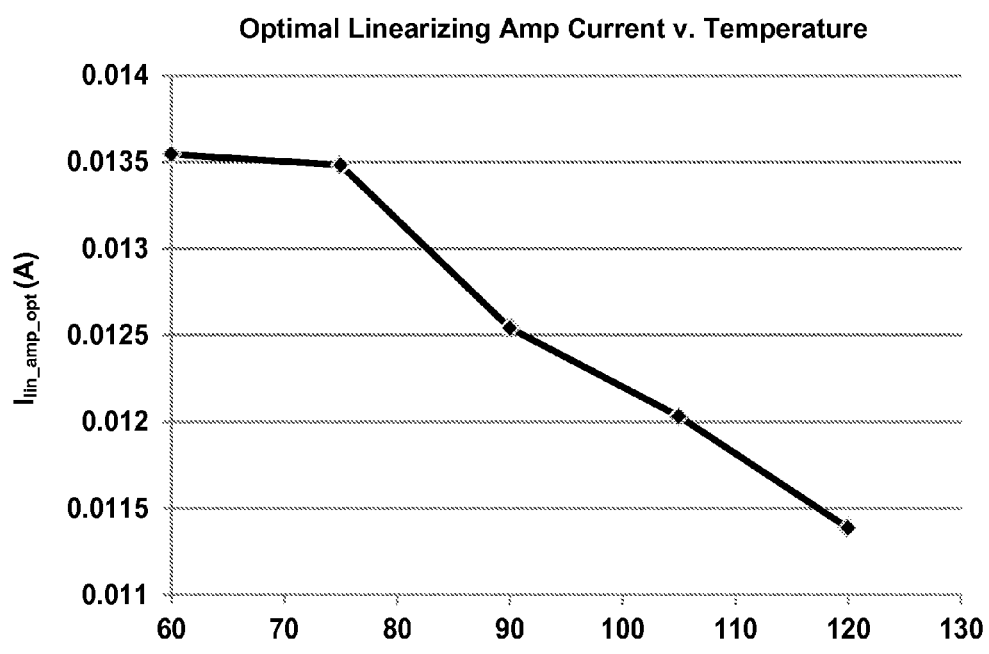

The method continues with determining 311 the optimal $I_{lin\_amp}$ as a function of temperature, and as best demonstrated in FIG. 9. The optimal $I_{lin\_amp}$ is generally referred to herein as $I_{lin\_amp\_opt}$, and can be computed by dividing $I_{main\_amp}$ from 303 by $I_{opt}$ determined at 309 (and also designated as $I_{ratio}$ in Table 2). Table 3 shows results for one example embodiment. As can be seen, $I_{lin\_amp\_opt}$ is a function of temperature, and in this particular example case, CTAT).

TABLE 3

| Temp | $I_{main\_amp}$ | $I_{opt}$ | $I_{lin\_amp\_opt}$ |
| --- | --- | --- | --- |
| 60° C. | 0.0149 A | 1.1 | 0.0135 A |
| 75° C. | 0.0151 A | 1.12 | 0.0134 A |
| 90° C. | 0.0153 A | 1.22 | 0.0125 A |
| 105° C. | 0.0154 A | 1.27 | 0.0121 A |
| 120° C. | 0.0156 A | 1.37 | 0.0113 A |

Once the optimal linearizing amplifier currents $I_{lin\_amp\_opt}$ are computed for each temperature of interest, the method continues with configuring 313 a temperature compensated reference generator specifically for the linearizing amplifier, so that $I_{ratio}$ v. temperature equals or otherwise sufficiently tracks $I_{opt}$ v. temperature within an acceptable tolerance (e.g., where $I_{ratio}$ v. temp tracks $I_{opt}$ v. temp within 20%, or where $I_{ratio}$ v. temp tracks $I_{opt}$ v. temp within 10%). Thus, in this example case, the temperature compensated reference generator can be designed to match the performance reflected in FIGS. 8 and 9 (or Table 3).

Figure 10:
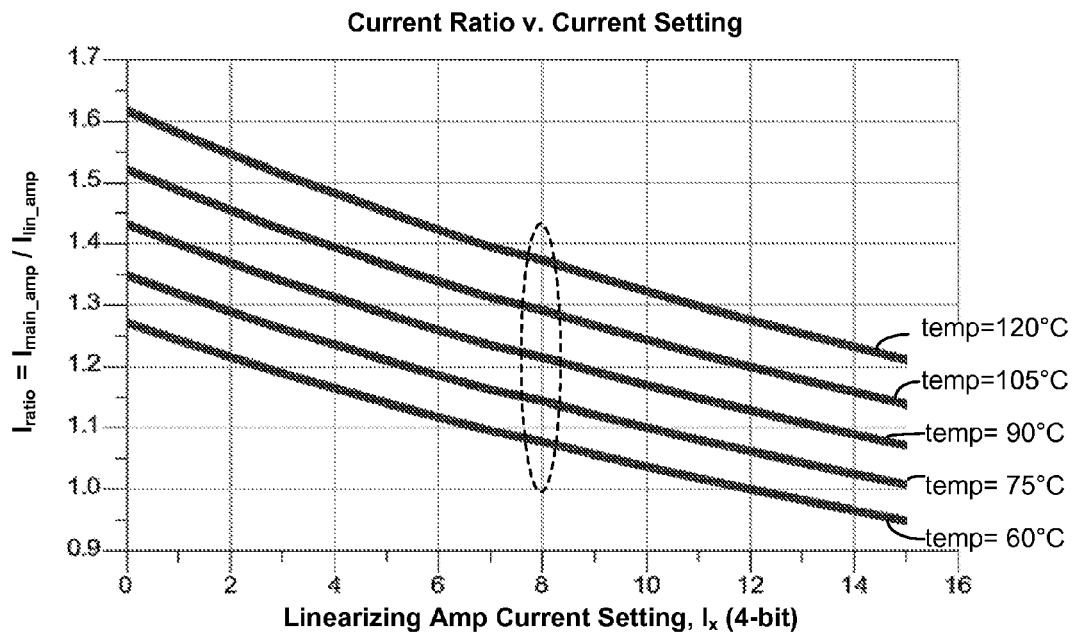
Figure 11:
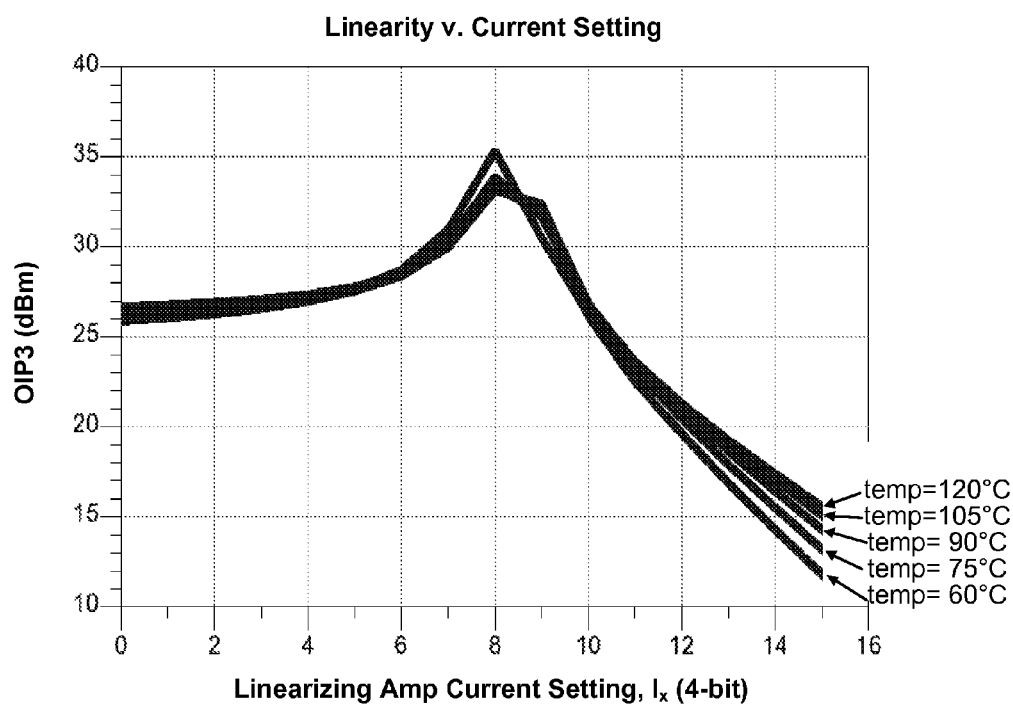

As best shown in FIG. 10, with a temperature compensated reference generator configured as described herein, $I_{ratio}$ is now a strong function of temperature (particularly when contrasted to the results shown in FIG. 6). As can be seen, when $I_x$=8 for instance, $I_{ratio}$ now increases with temperature as per the analysis in FIG. 8 and with reference to Table 2. As can be further seen with reference to FIG. 11, now a single setting of $I_x$ can be used to achieve optimal linearity for a wide range of temperatures. As such, the range of settings of $I_x$ can now be used to independently compensate for process variation, voltage variation, or other such variations.

Circuit Architecture

As will be appreciated, the techniques provided herein can be implemented with any number of feedforward linearizer circuit architectures, and the claimed invention is not intended to be limited to any particular architecture type or circuit design. Rather, any feedforward linearizer circuit design having main and linearizing amplifiers, and that can be configured with a separate reference generator for the linearizing amplifier that is designed to perform as described herein, can be implemented in accordance with an embodiment of the present invention.

FIGS. 12a and 12b illustrate example main and linearizing amplifiers, respectively, that can be used to implement a feedforward linearizer configured in accordance with an embodiment of the present invention. As can be seen, the main amplifier includes a pair of NPN input transistors configured in a differential transconductance configuration that receive a differential input signal ($In_n$ and $In_p$) at their respective bases. A pair of NPN output transistors is operatively coupled to the collectors of the input transistor pair, and may be for example, part of a cross-coupled Gilbert cell configuration. The output of this example main amplifier is taken at the collectors of the output transistor pair, and can be provided to a given load or intended circuit. As will be appreciated in light of this disclosure, the main amplifier can be any amplifier designed from a common or uncommon amplifier configuration. In general, the main amplifier is intended to apply linear gain to the signal, but in reality applies a non-linear gain creating distortion. A current source transistor is operatively coupled to the emitters of the input transistor pair, and has its base operatively coupled to a conventional reference generator.

The example linearizing amplifier shown in FIG. 12b also includes a pair of NPN input transistors configured in a differential transconductance configuration that receive a differential input signal ($V_n$ and $V_p$, sampled from the collectors of the input transistor pair of the main amplifier) at their respective bases. The sampled input signal $V_n$ and $V_p$ from the main path is distorted by the linearizing amplifier in a similar manner that the main amplifier distorts its input signal $In_n$ and $In_p$. The linearizing amplifier feeds the distorted signal forward back into the output signal path of the main amplifier, but out-of-phase thereby canceling any distortion products caused by the main amplifier. In this example embodiment, the linearizing amplifier is further configured with a tunable current source that allows up to four additional transistor current sources to be switched in (based on the binary word $I_x$). This arrangement effectively provides the amplifier with a digital-to-analog converter (DAC) that allows for adjustable amplification and/or capability compensation. In other embodiments, however, note that the current source area of the linearizing amplifier is fixed (e.g., single current source similar to the main amplifier). Each current source transistor has its base operatively coupled to a temperature compensated reference generator designed as described herein, such that $I_{ratio}$ v. temperature sufficiently tracks $I_{opt}$ v. temperature within an acceptable tolerance (e.g., 10% or better).

FIG. 12c illustrates an example temperature compensated reference generator of a feedforward linearizer configured in accordance with an embodiment of the present invention. The T-comp reference generator produces a voltage that is predictable over temperature and varying amounts of load. It is generally comprised of transistors and resistors from within a given semiconductor process, and can vary from simple resistive voltage dividers to complex feedback reference generators. In addition, the T-comp reference generator can be configured to have a flat response over temperature (commonly called a bandgap reference) or to be PTAT or CTAT. As will be appreciated in light of this disclosure, the reference generator is configured to match or otherwise sufficiently track relative changes in the intermodulation distortion cancellation over temperature.

This example includes cascaded stages of PTAT and diode references so as to provide a net CTAT output with all NPN transistors and polysilicon resistors. This allows for the reference generator less susceptible to process variation and only dependent on temperature. Thus, in some embodiments, the reference generator can be designed such that it only has dependency on two types of devices, one resistor type (e.g., polysilicon) and one transistor type (e.g., NPN). However, any number of configurations and semiconductor processes can be used, so long as the reference generator that is configured to sufficiently track relative changes in the intermodulation distortion cancellation over temperature as described herein.

Note that the examples shown have a fairly coarse resolution of 15° C. (where measurements are made at 60° C., 75° C., 90° C., 105° C., and 120° C.), but other embodiments may have a finer resolution (e.g., where measurements are made at a 1° resolution, or higher), or a coarser resolution (e.g., where measurements are made at a 25° resolution, or lower). In short, the resolution with respect to the temperature at which measurements are made can vary and will depend on the demands of the application at hand. Higher resolution is more suitable, for example, for applications having sensitivity to relatively small temperature variations. In a more general sense, resolution with respect to the number of temperatures at which measurements are made can be set to provide the desired performance.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for making a feedforward linearizer device, the method comprising the steps of:
providing a main amplifier having a first reference node;
providing a linearizing amplifier operatively coupled to the main amplifier, and having a second reference node;
providing a first reference generator operatively coupled to the main amplifier by the first reference node; and
providing a second reference generator operatively coupled to the linearizing amplifier by the second reference node, being configured to cause an optimal linearizing amplifier output current for each of a plurality of temperatures, and identifying peak linearity of the linearizing amplifier for one or more linearizing amplifier current settings at each of the temperatures, wherein peak linearity is measured by the $3^{rd}$ order output intercept point (OIP3).

2. The method of claim 1 wherein providing the second reference generator further comprises:
determining a ratio of the main amplifier output current and the linearizing amplifier output current for each of the one or more linearizing amplifier current settings at each of the temperatures.

3. The method of claim 1 wherein there is a plurality of linearizing amplifier current settings.

4. A feedforward linearizer device, comprising:
a main amplifier having a first reference node;
a linearizing amplifier operatively coupled to the main amplifier, and having a second reference node, wherein the linearizing amplifier is configured with a tunable current source that is controlled by a second reference generator so as to provide a plurality of linearizing amplifier current settings;
a first reference generator operatively coupled to the main amplifier by the first reference node; and
the second reference generator operatively coupled to the linearizing amplifier by the second reference node, and configured to cause an optimal linearizing amplifier output current for each of a plurality of temperatures.

5. The device of claim 4 wherein the second reference generator is configured to cause the optimal linearizing amplifier output current for each of a plurality of temperatures based on a corresponding optimal ratio of main amplifier output current and linearizing amplifier output current.

6. The device of claim 4 wherein the linearizing amplifier is associated with a peak linearity for one or more linearizing amplifier current settings at each of the temperatures, wherein peak linearity is measured by the $3^{rd}$ order output intercept point (OIP3).

7. The device of claim 4 wherein the linearizing amplifier is configured with a current source having a fixed total transistor area.

8. The device of claim 4 wherein the device is implemented as a system-on-chip or chip set.

9. A feedforward linearizer device, comprising:
a main amplifier having a first reference node;
a linearizing amplifier operatively coupled to the main amplifier, and having a second reference node, wherein the linearizing amplifier is associated with a peak linearity for one or more linearizing amplifier current settings at each of a plurality of temperatures, wherein peak linearity is measured by the $3^{rd}$ order output intercept point (OIP3); and wherein the linearizing amplifier is configured with a tunable current source that is controlled by a second reference generator so as to provide a plurality of linearizing amplifier current settings;
a first reference generator operatively coupled to the main amplifier by the first reference node; and
the second reference generator operatively coupled to the linearizing amplifier by the second reference node, and configured to cause an optimal linearizing amplifier output current for each of the plurality of temperatures based on a corresponding optimal ratio of main amplifier output current and linearizing amplifier output current.

10. The device of claim 9 wherein the linearizing amplifier is configured with a current source having a fixed total transistor area.

11. The device of claim 9 wherein the device is implemented as a system-on-chip or chip set.

* * * * *